(12) United States Patent
Peters et al.

(10) Patent No.: US 10,537,022 B2
(45) Date of Patent: Jan. 14, 2020

(54) FLEXIBLE ELECTRONIC SYSTEM

(71) Applicant: Robert Bosch GmbH, Stuttgart (DE)

(72) Inventors: Christian Peters, Palo Alto, CA (US); Seow Yuen Yee, Mountain View, CA (US); Bongsang Kim, Mountain View, CA (US)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 16/062,914

(22) PCT Filed: Dec. 8, 2016

(86) PCT No.: PCT/EP2016/080173
§ 371 (c)(1),
(2) Date: Jun. 15, 2018

(87) PCT Pub. No.: WO2017/102525
PCT Pub. Date: Jun. 22, 2017

(65) Prior Publication Data
US 2018/0376587 A1    Dec. 27, 2018

Related U.S. Application Data

(60) Provisional application No. 62/267,808, filed on Dec. 15, 2015.

(51) Int. Cl.
*H05K 1/02* (2006.01)
*H01M 6/38* (2006.01)
(Continued)

(52) U.S. Cl.
CPC .......... *H05K 1/0293* (2013.01); *H01M 2/344* (2013.01); *H01M 6/38* (2013.01); *H05K 1/0393* (2013.01); *H05K 1/185* (2013.01); *H01M 2220/30* (2013.01); *H05K 2203/0264* (2013.01); *H05K 2203/173* (2013.01)

(58) Field of Classification Search
USPC ......................................................... 361/749
See application file for complete search history.

(56) References Cited

U.S. PATENT DOCUMENTS

| | | | |
|---|---|---|---|
| 6,576,364 B1 * | 6/2003 | Mitchell, Jr. ........... | G02F 1/153 29/623.5 |
| 2010/0263247 A1 * | 10/2010 | Liguori ..................... | G09F 3/10 40/542 |

OTHER PUBLICATIONS

International Search Report corresponding to PCT Application No. PCT/EP2016/080173, dated Mar. 17, 2017 (2 pages).

\* cited by examiner

*Primary Examiner* — Andargie M Aychillhum
(74) *Attorney, Agent, or Firm* — Maginot, Moore & Beck LLP (57) ABSTRACT

A flexible electronic system includes a flexible electronic substrate having a first and second contact pads opposed to each other, one of the first and second contact pads is electrically coupled to a battery. A protective cover is disposed on the flexible electronic substrate. The flexible electronic system further includes a base support fixedly attached to the flexible electronic substrate, the base support having an adhesive surface opposed to the flexible electronic substrate, and a foil having a first portion removably coupled to at least a portion of the adhesive surface and a second portion, wherein the foil configures to permit a removal of the second portion disposed between the first and second contact pads and wherein the removal of the second portion activates the system.

20 Claims, 10 Drawing Sheets

(51) Int. Cl.
*H05K 1/03* (2006.01)
*H05K 1/18* (2006.01)
*H01M 2/34* (2006.01)

FLEXIBLE ELECTRONIC SYSTEM

CROSS-REFERENCE TO RELATED APPLICATION

This application is a 35 U.S.C. § 371 National Stage Application of PCT/EP2016/080173, filed on Dec. 8, 2016, which claims the benefit of priority to a U.S. provisional patent application Ser. No. 62/267,808, filed Dec. 15, 2015, the contents of which are incorporated herein by reference as if fully enclosed herein.

FIELD

This disclosure relates generally to electronic systems and particularly to a flexible electronic system.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

Embodiments of the disclosure related to a flexible electronic system includes a flexible electronic substrate having a first and second contact pads opposed to each other, one of the first and second contact pads is electrically coupled to a battery, a base support fixedly attached to the flexible electronic substrate, the base support having an adhesive surface opposed to the flexible electronic substrate, and a foil having a first portion removably coupled to at least a portion of the adhesive surface and a second portion, wherein the foil configures to permit a removal of the second portion disposed between the first and second contact pads and wherein the removal of the second portion activates the battery. The foil further comprises a grip portion formed between the first and second portion. The grip portion wrapped around a portion of the system. The grip portion in one embodiment, a distant away from the system, defining a gap. A slit is formed on the grip portion to facilitate separation of the first portion from the second portion. The foil further comprising a third portion having an end, the third portion is removably attached to the other portion of the adhesive surface, wherein the third portion is connected to the second portion and wherein the third and second portions share the same end. The system further comprises a component electrically to one of the other first and seconds contact pads. The component is selected from a group consisting of a sensor, a processer, a computer readable media, a communication interface, an ASIC, a capacitor, a transistor, and a resistor. The component and the battery are integrated into the flexible electronic substrate. The flexible electronic substrate may be formed from dielectric material such as fiberglass-filled epoxy and polyimide, FR-2 (phenolic cotton paper), FR-3 (cotton payer and epoxy), FR-4 (woven glass and epoxy), FR-5 (woven glass and epoxy), FR-6 (matte glass and polyester), G-10 (woven glass and epoxy), CEM-1 (cotton payer and epoxy), CEM-2 (woven paper and epoxy), CEM-3 (woven glass and epoxy), CEM-4 (woven glass and epoxy), CEM-5 (woven glass and polyester), polystyrene, polyimide, polytetrafluoroethylene (PTFE), plastic, ceramics, polymer coated with Parylene.

According to another exemplary embodiment of the disclosure, a flexible electronic system includes a flexible electronic substrate having a first and second contact pads opposed to each other, one of the first and second contact pads is electrically coupled to a battery, and a foil having a first portion and a second portion, wherein the foil configured to permit a removal of the second portion disposed between the first and second contact pads and wherein the removal of the second portion activates the battery. The flexible electronic substrate may be formed from dielectric material such as a group consisting of fiberglass-filled epoxy and polyimide, FR-2 (phenolic cotton paper), FR-3 (cotton payer and epoxy), FR-4 (woven glass and epoxy), FR-5 (woven glass and epoxy), FR-6 (matte glass and polyester), G-10 (woven glass and epoxy), CEM-1 (cotton payer and epoxy), CEM-2 (woven paper and epoxy), CEM-3 (woven glass and epoxy), CEM-4 (woven glass and epoxy), CEM-5 (woven glass and polyester), polystyrene, polyimide, polytetrafluoroethylene (PTFE), plastic, ceramics, polymer coated with Parylene.

BRIEF DESCRIPTION OF THE DRAWINGS

These and other features, aspects, and advantages of this disclosure will become better understood when the following detailed description of certain exemplary embodiments is read with reference to the accompanying drawings in which like characters represent like arts throughout the drawings, wherein.

DETAILED DESCRIPTION

The following description is presented to enable any person skilled in the art to make and use the described embodiments, and is provided in the context of a particular application and its requirements. Various modifications to the described embodiments will be readily apparent to those skilled in the art, and the general principles defined herein may be applied to other embodiments and applications without departing from the spirit and scope of the described embodiments. Thus, the described embodiments are not limited to the embodiments shown, but are to be accorded the widest scope consistent with the principles and features disclosed herein.

Figure 1:
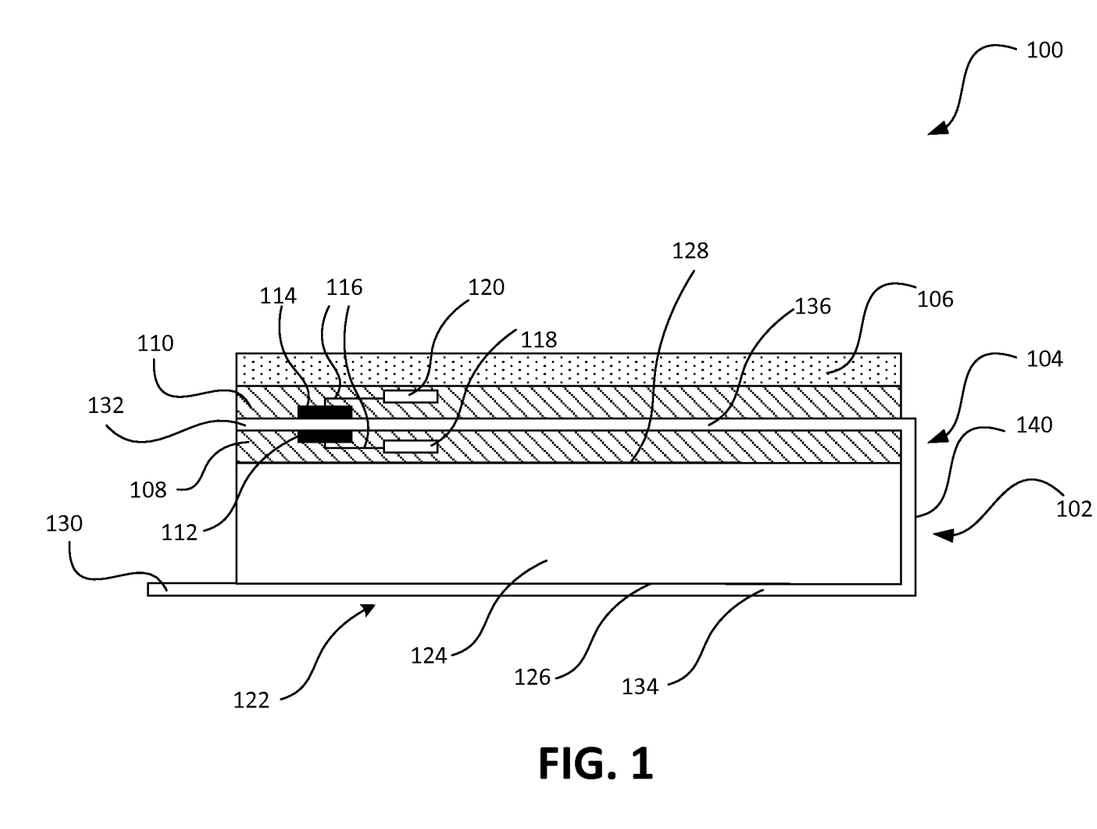
FIG. 1 is a cross sectional view of an exemplary flexible electronic system according to the disclosure.

FIG. 1 illustrates an exemplary flexible electronic system 100 according to the disclosure. The flexible electronic system 100 is formed in a film shape or a sheet shape, although, the flexible electronic system 100 may come in different sizes, shapes, thickness, weights, colors, depending on the applications. The flexible electronic system 100 easily attached to at least one site may be disposable, recyclable, deformable, stretchable, twistable, bendable, and squeezable, depending on the application. The site includes any human body part, any surface of an object including animal, produce, packaging, computer and electronic machines, or the like. The flexible electronic system 100 includes a flexible substrate 102, a flexible electronic substrate 104 supported by the flexible substrate 102, and a flexible protective cover 106 mounted on the flexible electronic substrate 104. The flexible protective cover 106, also in a film shape or a sheet shape, may be formed from a material such as plastic, thin glass, fiber composites, thin metal, fabric, silicone, and the like. The flexible protective cover 106 may also be formed from either a single layer of material or multiple layers of material formed from any types of deformable material. Other types of material such as stretchable, twistable, bendable, squeezable, flexible, or the like, depending on the applications, can be used.

The flexible electronic substrate 104 includes a first layer 108 and a second layer 110. In some embodiments, single layer or multiple electronic layers can be fabricated, depending on the applications. Similar to the flexible protection cover 106, the flexible electronic substrate 104 can be in a film shape or a sheet shape, although other sizes, shapes, thickness, weights, and colors may be used. First and second layers 108, 110 may contained patterned conductive traces that convey signals between components. In one embodiment, the first layer 108 may be a rigid layer and the second layer 110 may be a flexible layer stacked on the rigid layer. In another embodiment, the flexible electronic substrate 104 may be formed from a single rigid-flex circuit. In yet another embodiment, the flexible electronic substrate 104 is formed from a single sheet or film and then is bended/folded into two or more to form first and second layers 108, 110. The layers 108, 110 may be formed from dielectrics such as fiberglass-filled epoxy and polyimide, FR-2 (phenolic cotton paper), FR-3 (cotton payer and epoxy), FR-4 (woven glass and epoxy), FR-5 (woven glass and epoxy), FR-6 (matte glass and polyester), G-10 (woven glass and epoxy), CEM-1 (cotton payer and epoxy), CEM-2 (woven paper and epoxy), CEM-3 (woven glass and epoxy), CEM-4 (woven glass and epoxy), CEM-5 (woven glass and polyester), polystyrene, polyimide, polytetrafluoroethylene (PTFE), plastic, ceramics, or other suitable dielectrics. In another embodiment, the layers 108 and 110 are formed from flexible polymer which in this embodiment is a thin-film coating of Parylene. In other embodiments, a non-polymer flexible material is used. As used herein, "Parylene" means a polymerization of para-xylylene (poly(p-xylylene) or its substituted derivatives. In different embodiments, a deposited Parylene is passive or reactive. In at least one embodiment, a deposited Parlyene is halogenated, such as with Fluorine, Chlorine, or Bromine. In some embodiments, the Parylene is a Parylene variant such as Parylene HT, Parylene A, Parylene AM, Parylene AF-4, Parylene N, Parylene C, Paryleme D, or Parylene X polymers.

As depicted in FIG. 1, the flexible electronic substrate 104 includes a contact pad, two contact pads 112, 114 are illustrated. More or less than two contact pads may be provided on the substrate 104, depending on the application. The first contact pad 112 is formed on the first layer 108 and the second contact pad 114 is formed on the second layer 110. In one embodiment, the contact pads 112, 114 formed as part of the components 118, 120 are electrically coupled to one or more of the components 118, 120 via traces or interconnects 116. In some embodiment, the components 118, 120 are either mounted on the layers 108, 110, integrated into the layers 108, 110, or disposed on the layers 108, 110. The components 118, 120 may be sensors, processors, computer readable media, communication interfaces, ASICs, energy storage elements, capacitors, transistors, resistors, and any electronic components. As illustrated in FIG. 1, the contact pad 112 is electrically coupled to an energy source, such as a battery 118 via trace 116 and the contact pad 114 is electrically coupled to at least one component 120 via different trace 116. In some embodiments, the flexible electronic substrate 104 may be fabricated as a single layer and the components 118, 120 are disposed on the common layer. The energy storage elements, in some embodiments, may be primary batteries, secondary batteries, solid-state batteries, capacitors, supercapacitors, and the like.

The flexible substrate 102 may come in contact with the site includes a non-conductive foil 122 and a base support 124. An adhesive material may be acrylic polymers, rubber-based polymers, and any suitable materials having adhesive properties is formed on a first surface 126 of the base support 124. The non-conductive foil 122 covers the adhesive surface 126 while the system 100 is either not in use or is not yet applied to the site. In other words, adhesive surface 126 configured to attach the system 100 to the site can be new and either ready to be used by stakeholders or ready to be shipped, exported, delivered, and distributed to the stakeholders. The stakeholders include users, consumers, retailers, distributors, warehouse personnel, manufactures, or the like. A second surface 128 opposed to the first surface 126 is fixedly mounted or attached to the first layer 108 of the flexible electronic substrate 104 by any attachment techniques. In some embodiments, additional layers may be formed between the base support 124 and the flexible electronic substrate 104 to increase the rigidity of the system 100. Additional layers may also enhance the durability of the system 100 to withstand wear and tear either during use, transport, or handling of the system 100. The base support 124 may be formed from any types of material.

The non-conductive foil 122 folded in a U-shape includes a first end 130 extended a distance from an end wall of the base support 124, a second end 132 terminates at the end wall of the base support 124, and an intermediate portion 140 between the first and second ends 130, 132 wrapped along an exterior wall of the system 100 to form a U-shape. In some embodiments, the non-conductive foil 122 may be folded in different shapes such as S-shape, C-shape, Z-shape, depending on the applications. In some embodiments, the intermediate portion 140 may be formed within the system 100 having a vias or channel to receive the intermediate portion 140 so that the intermediate portion 140 is hidden from the environment. A first portion 134 of the non-conductive foil 122 adjacent to the first end 130 is removably attached to the first surface 126 of the base support 124 and a second portion 136 of the non-conductive foil 122 is removably attached between the first and second layers 108, 110 of the flexible electronic substrate 104, in order to prevent energy signal drawn by the component 120 via the contact pads 112, 114 that is supplied by the battery 118 before first time use of the flexible electronic system 100. The non-conductive foil 122 formed between the contact pads 112, 114 also prevents the contact pads 112, 114 from corrosion reactions, moisture, and gas pressure caused by or exposed to the environment.

To activate the flexible electronic system 100, simply hold the first end 130 of the non-conductive foil 122 with fingers to peel off the foil 122 from the base substrate 124 to expose the adhesive surface 126 of the base substrate 124. Once the adhesive surface 126 is completely exposed, continue to hold the foil 122 and then pull the foil 122 away from the system 100 until the foil 122 is completely separated from the flexible electronic system 100 so that the contact pads 112, 114 are in contact to activate the battery of the flexible electronic system 100.

Figure 2:
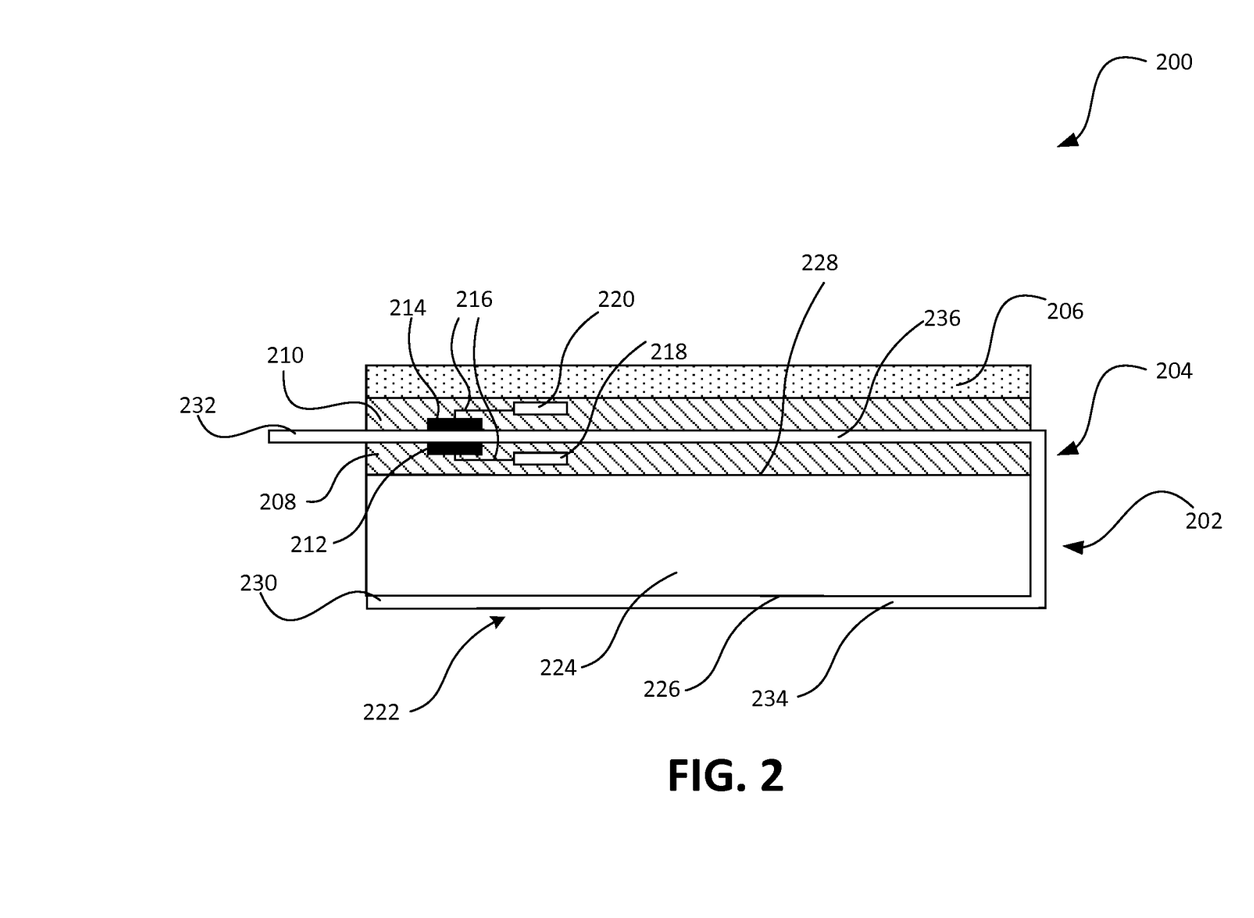
FIG. 2 is a cross sectional view of another described embodiment of flexible electronic system according to the disclosure.

FIG. 2 illustrates another described embodiment of a flexible electronic system 200 according to the disclosure. The flexible electronic system 200 is similar in construction to the system 100 of FIG. 1. In contrast to the system 100 in FIG. 1, the non-conductive foil 222 folded in a U-shape includes a first end 230 terminates at an end wall of a base support 224 and a second end 232 extended a distance from the end wall of the base support 224. To activate the flexible electronic system 200, simply hold the second end 232 of the non-conductive foil 222 with fingers and peel off the foil 222 from the base substrate 224 to expose the adhesive surface 226. Once the adhesive surface 226 is completely exposed, continue to hold the foil and then pull the foil 222 away from the system 200 until the foil 222 is completely separated from the system 200 so that the contact pads 212, 214 are in contact to activate the flexible electronic system 200.

Figure 3:
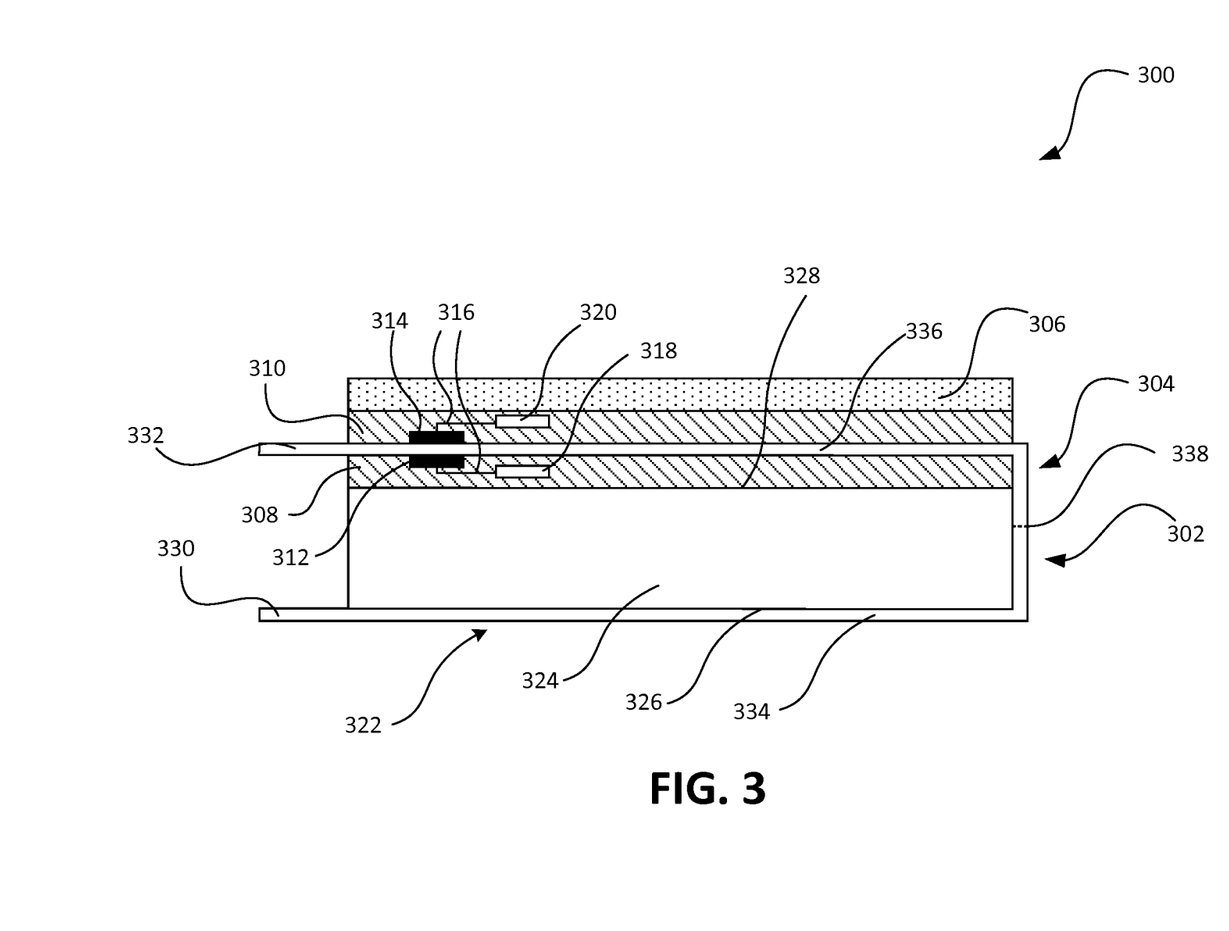
FIG. 3 is a cross sectional view of another described embodiment of flexible electronic system according to the disclosure.

FIG. 3 illustrates another described embodiment of a flexible electronic system 300 according to the disclosure. The flexible electronic system 300 is similar in construction to the system 100 of FIG. 1. In contrast to the system 100 in FIG. 1, the non-conductive foil 322 folded in a U-shape includes a first end 330 and a second end 332, both extended a distance from an end wall of the base support 324. A slit 338 is formed on the non-conductive foil 322 to facilitate the handleability when separation or removal of the foil 322 from the system 300.

To activate the flexible electronic system 300, simply hold and pull the second end 332 of the non-conductive foil 322 with fingers until the second portion 336 broke away from the first portion 334 along the slot 338. Continue to pull the second end 332 until the foil 322 is completely separated from the system 300 so that the contact pads 312, 314 are in contact to activate the flexible electronic system 300. To attach the system on the site, hold the first end 330 of the foil 322 with fingers and peel the foil 322 from the base substrate 324 until the adhesive surface 326 is completed exposed ready to be applied onto the site. Since the first portion 334 of the foil 322 is no longer attached with the first portion 336, it is easy to remove the foil 322 effortlessly.

Figure 4:
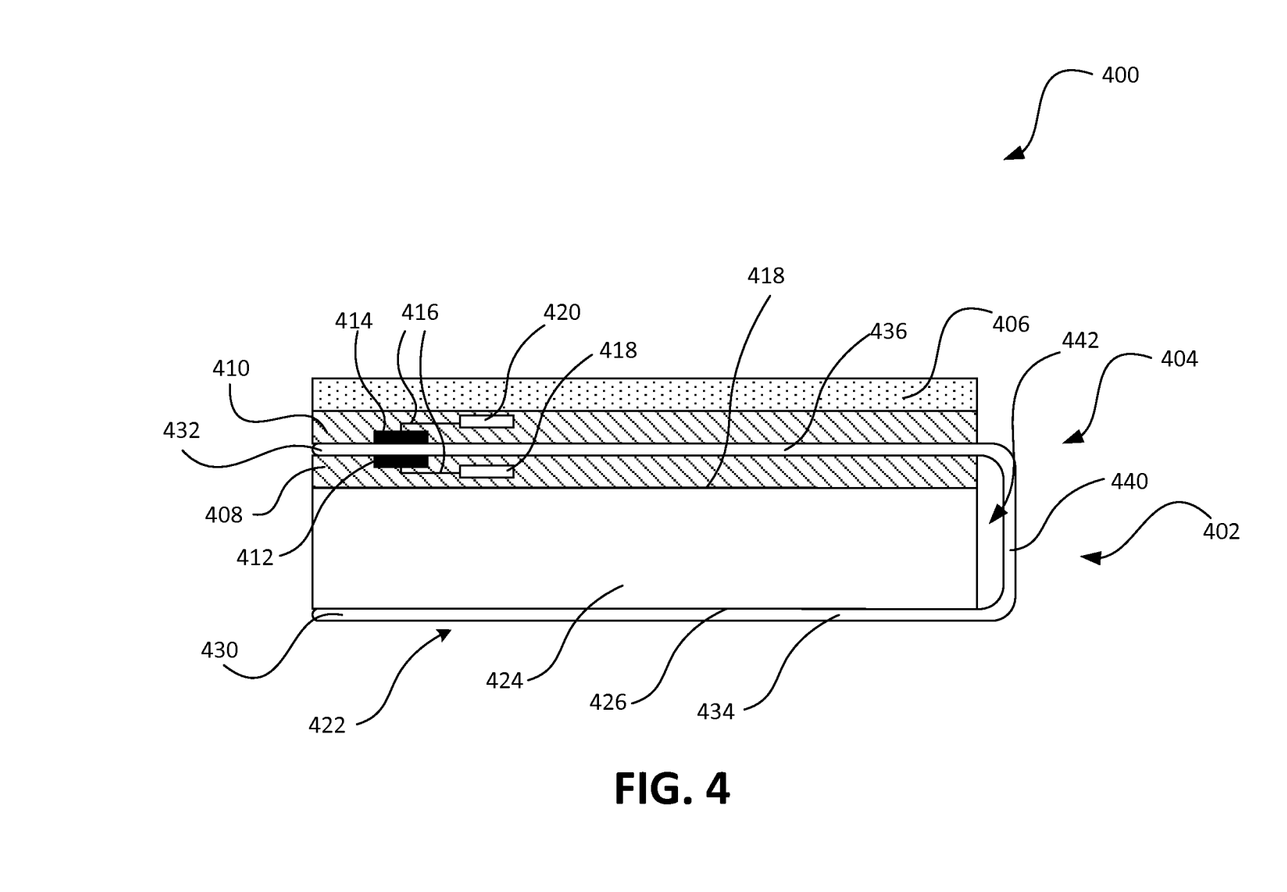
FIG. 4 is a cross sectional view of another described embodiment of flexible electronic system according to the disclosure.

FIG. 4 illustrates another described embodiment of a flexible electronic system 400 according to the disclosure. The flexible electronic system 400 is similar in construction to the system 100 of FIG. 1. In contrast to the system 100 in FIG. 1, the non-conductive foil 422 folded in a U-shape include a first end 430 and a second end 432, both terminate at an end wall of the base support 424. An intermediate portion also referred as a grip portion 440 formed between first and second portions 434, 436 extends a distance away from the system 400 in a non-contact relationship with the system 400 and a space formed between the system 400 and the grip portion 440 defines a gap 442 for receiving fingers are provided. To activate the flexible electronic system 400, simply hold the grip portion 440 with fingers and pull the folded non-conductive foil 422 until the entire foil 422 is completely removed from the flexible electronic system 400. The adhesive surface 426 is now exposed and the contact pads 412, 414 are thus in contact with each other to activate the flexible electronic system 400.

Figure 5:
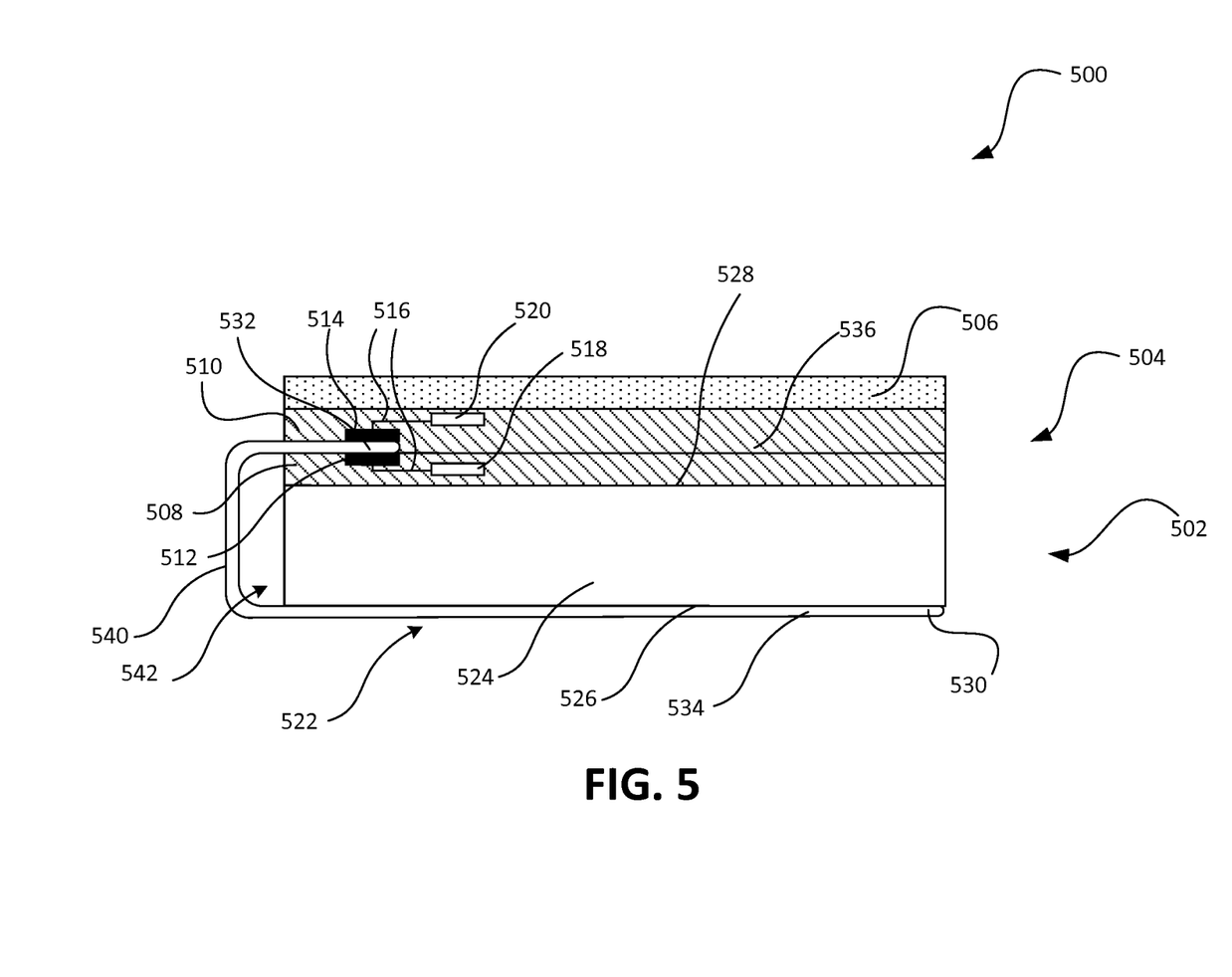
FIG. 5 is a cross sectional view of another described embodiment of flexible electronic system according to the disclosure.

FIG. 5 illustrates another described embodiment of a flexible electronic system 500 according to the disclosure. The flexible electronic system 500 is similar in construction to the system 100 of FIG. 1. In contrast to the system 100 in FIG. 1, the non-conductive foil 522 folded in a U-shape include a first end 530 and a second end 532. The first end 530 terminates at an end wall of the base support 524 and the second end 532 terminates at the contact pads 512, 514 yet electrically isolates the contact pad 512 with the contact pad 514. An intermediate portion also referred as a grip portion 540 formed between first and second portions 534, 536 extends a distance from the system 500 in a non-contact relationship and a space formed between the system 500 and the grip portion 540 defines a gap 542 for receiving fingers are provided. To activate the flexible electronic system 500, simply hold the grip portion 540 with fingers and pull the folded non-conductive foil 522 until the foil 522 is completely removed from the flexible electronic system 500. The adhesive surface 526 is now exposed and the contact pads 512, 514 are thus in contact with each other to activate the flexible electronic system 500.

Figure 6:
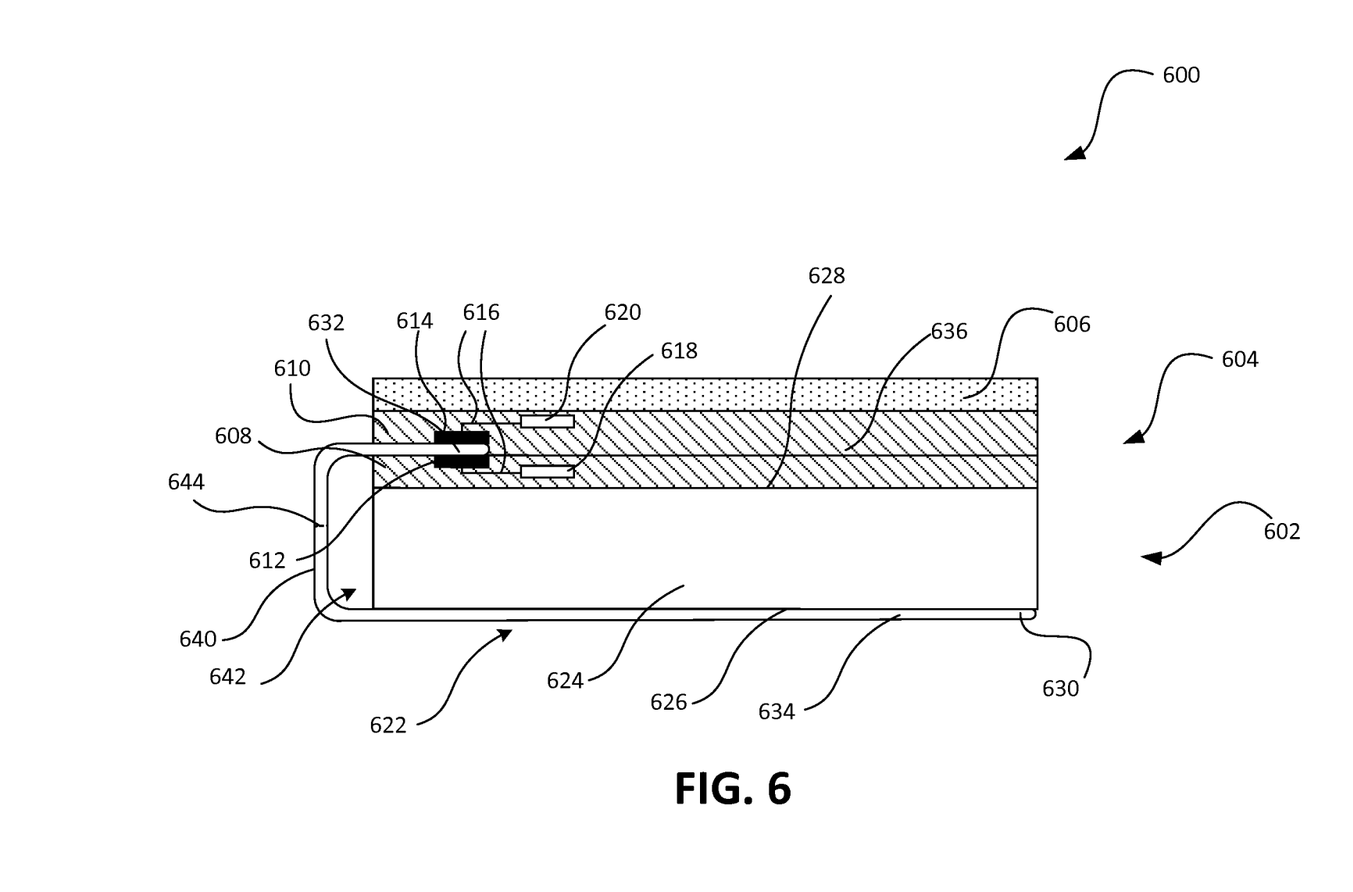
FIG. 6 is a cross sectional view of another described embodiment of flexible electronic system according to the disclosure.

FIG. 6 illustrates another described embodiment of a flexible electronic system 600 according to the disclosure. The flexible electronic system 600 is similar in construction to the system 100 of FIG. 1. In contrast to the system 100 in FIG. 1, the non-conductive foil 622 folded in a U-shape include a first end 630 and a second end 632. The first end 630 terminates at an end wall of the base support 624 and the second end 632 terminates at the contact pads 612, 614 yet electrically isolates the contact pad 612 with the contact pad 614. An intermediate portion also referred as a grip portion 640 formed between first and second portions 634, 636 extends a distance from the system 600 and a space formed between the grip portion 640 and the system 600, defines a gap 642 are provided.

A slit 644 formed on the grip portion 640 is configured to facilitate the handleability when separation or removal of the foil 622 from the system 600. To activate the flexible electronic system 600, hold the grip portion 640 with fingers and break along the slit 644 to separate the two portions 632, 634 apart. Once the portions 632, 634 are separate, hold and pull one end of the portion 632 that is adjacent to the slit 644 until the foil 622 is completely separated from the system 600 so that the contact pads 612, 614 are in contact to activate the flexible electronic system 600. Next, hold the other end of the portion 634 that is adjacent to the slit 644 with fingers and peel the foil 622 from the base substrate 624 until the adhesive surface 626 is completed exposed ready to be applied onto the site.

Figure 7A:
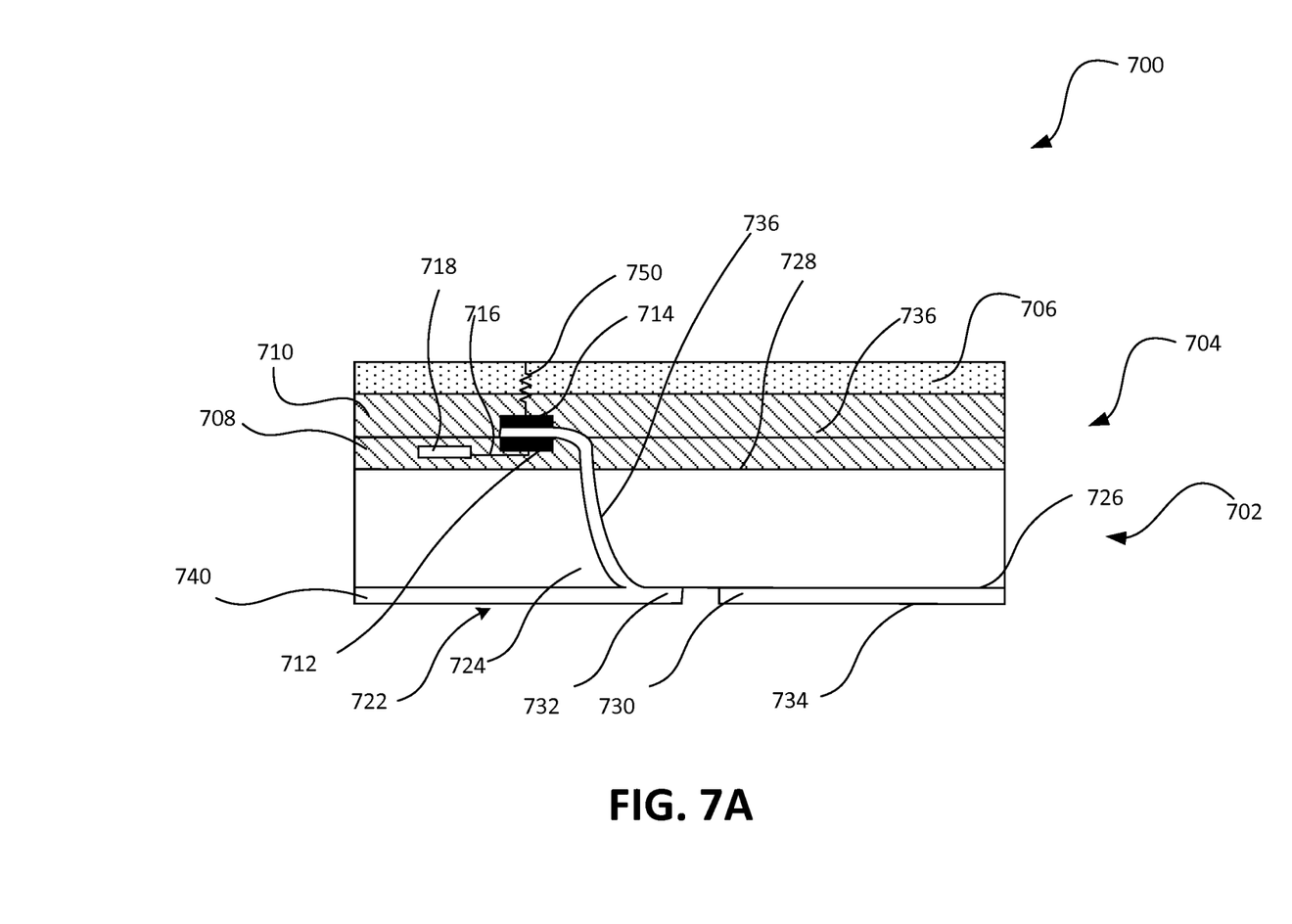
FIG. 7A is a cross sectional view of another described embodiment of flexible electronic system according to the disclosure.
Figure 7B:
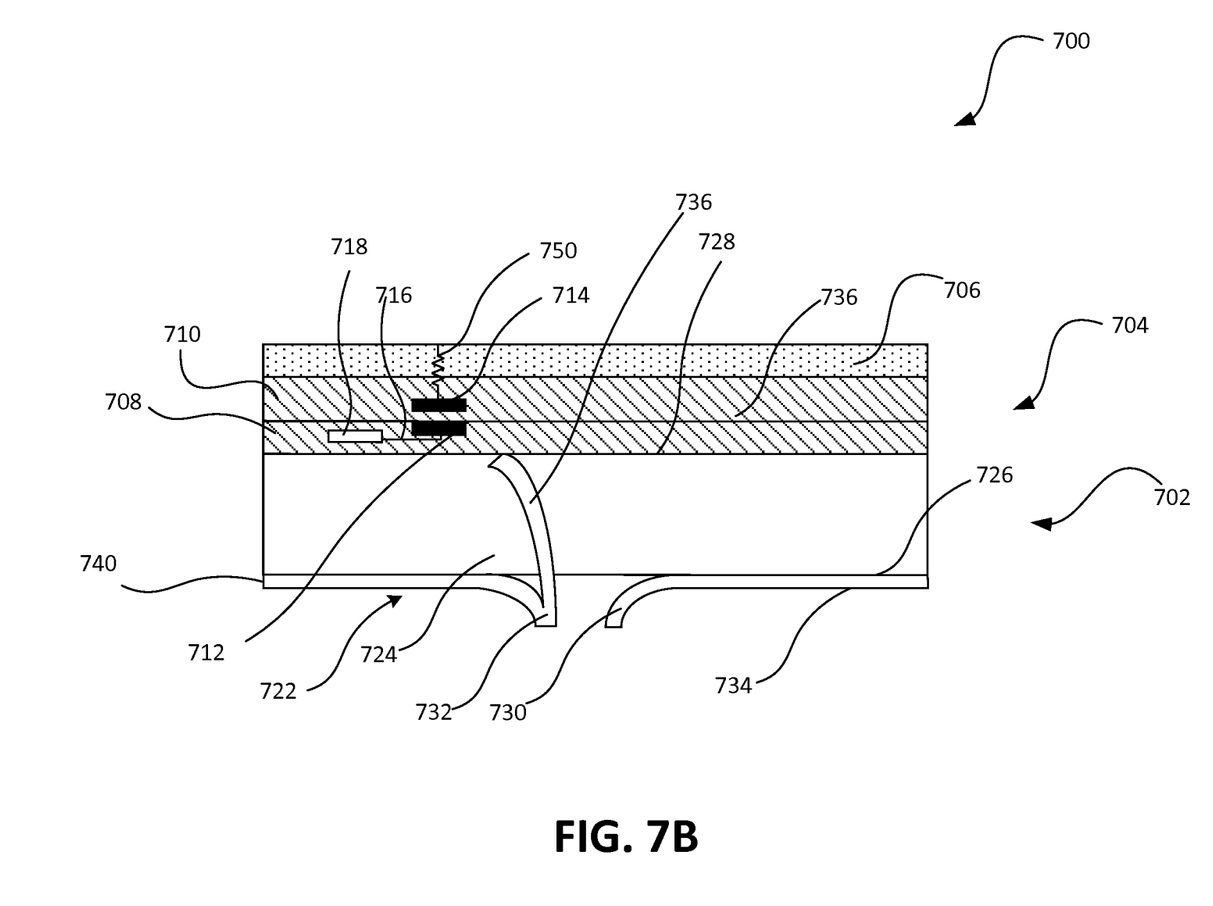
FIG. 7B is a cross sectional view depicting the state of the flexible electronic system of FIG. 7A after a portion of the non-conductive foil has been peel off.

FIG. 7A and FIG. 7B illustrate another described embodiment of a flexible electronic system 700 according to the disclosure. The flexible electronic system 700 is similar in construction to the system 100 of FIG. 1. In contrast to the system 100 in FIG. 1, the non-conductive foil 722 a first portion 734, a second portion 736, and a third portion 740 partially coupled to the second portion 736 at an end 732 to form a Y-shape. The first portion 734 having an end 730 is separated from the third portion 740 to improve handleability during the removal and reapply operations of the foil and either expose or cover the adhesive surface 626. As can be seen on FIG. 7A, the second portion 736 is removably attached to the contact pads 712, 714. For simplicity, other components except the battery 718 are not illustrated herein. A spring or biasing element 750 is coupled to one of the contact pads 714. To activate the flexible electronic system 700, hold the end 732 of the third portion 740 using fingers and slightly bend the end 732 outwardly or away from the system 700, as depicted in FIG. 7B. Continue to bend the third portion 740 until the second portion 736 is detached from the contact pads 712, 714 such that the contact pads 712, 714 are in contact with each other to activate the battery 718. Continue to bend and peel the rest of the third portion 740 until a portion of the adhesive surface 726 covered by the third portion 740 is now exposed. Now, hold the end 730 of the first portion 726 with fingers to peel the first portion 726 off the adhesive surface 726 until the remaining portion of the adhesive surface 726 initially covered by the first portion 726 is now exposed. Finally, the system 700 is now ready to be applied onto the site.

Figure 8A:
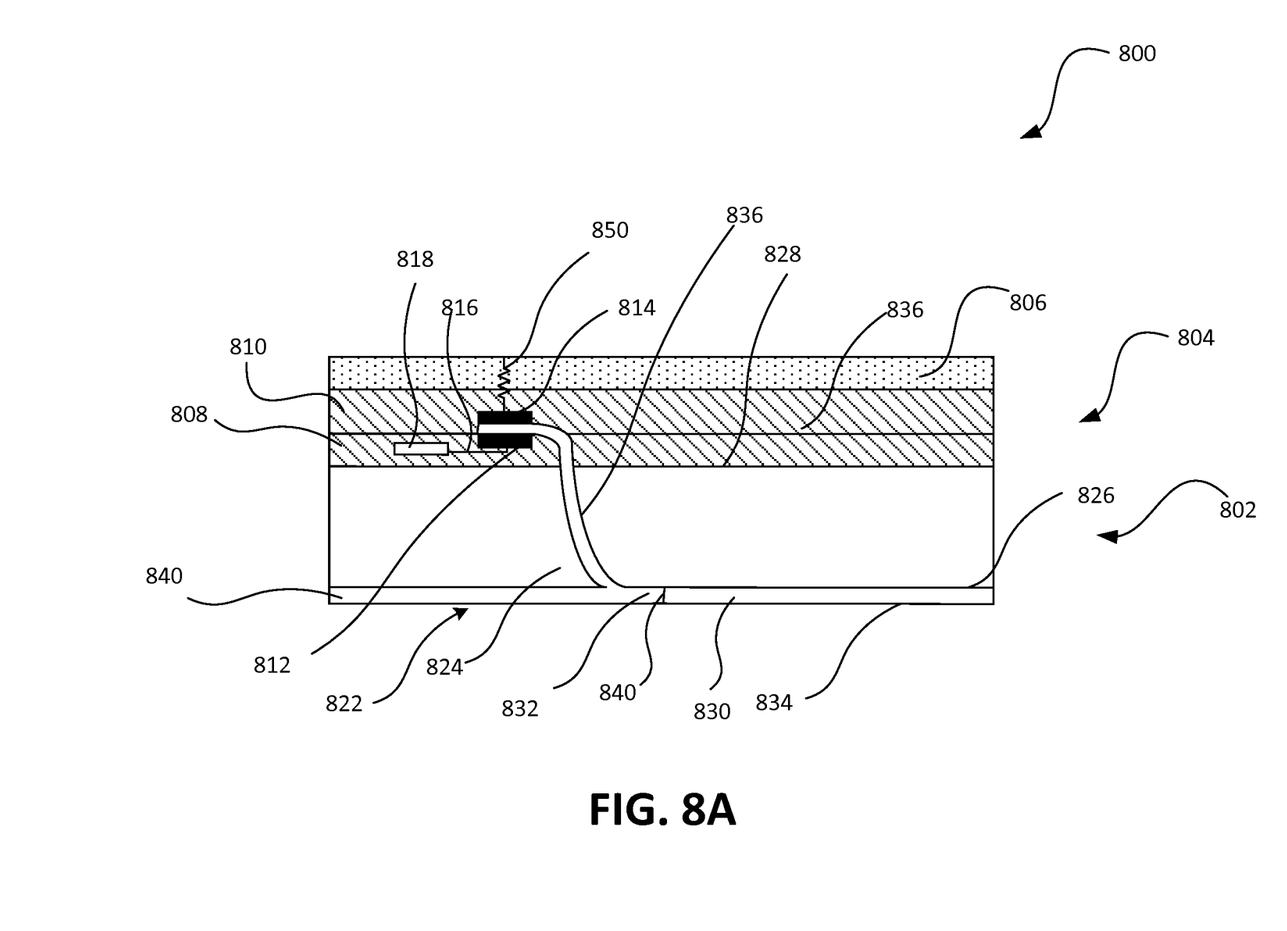
FIG. 8A is a cross sectional view of another described embodiment of flexible electronic system according to the disclosure.
Figure 8B:
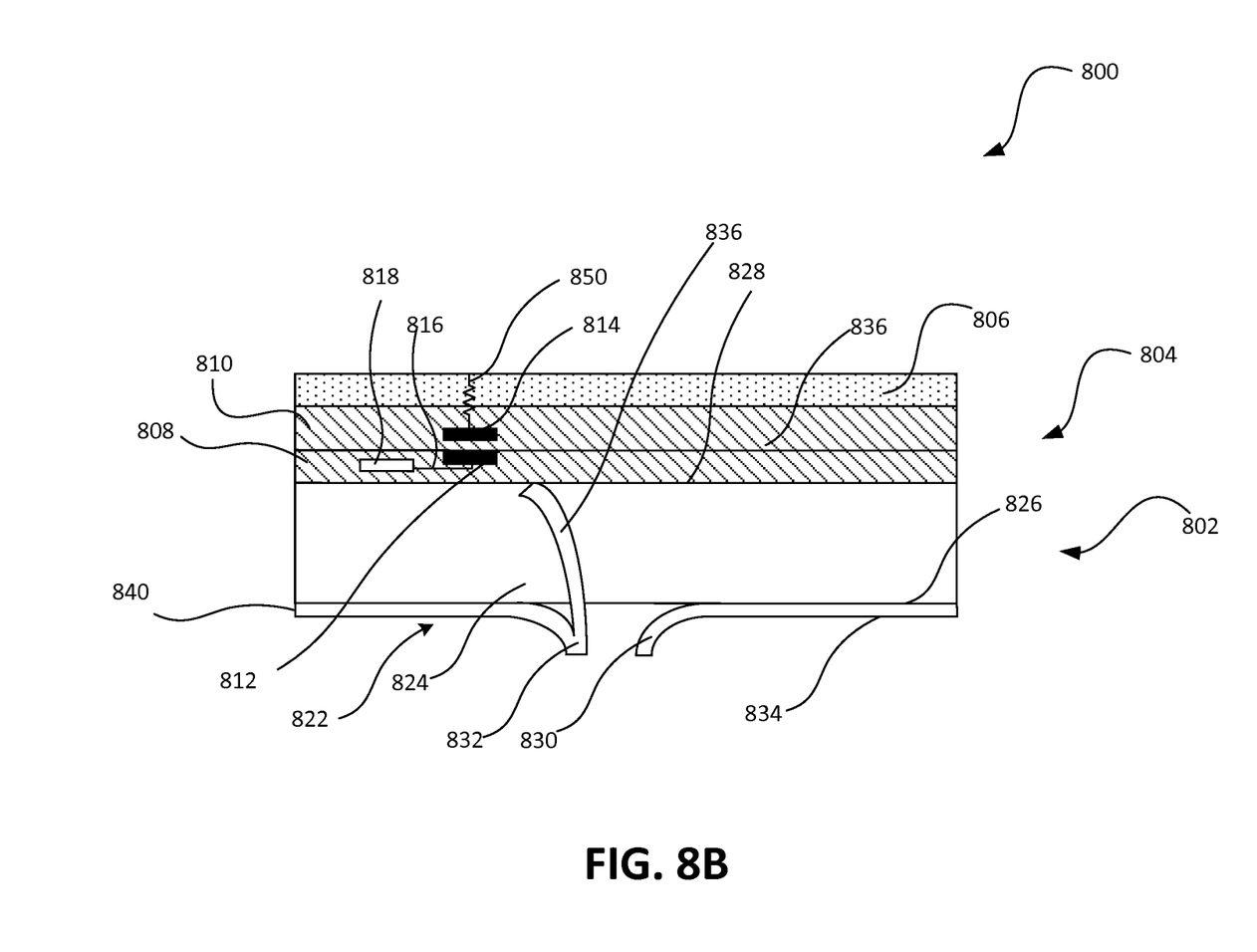
FIG. 8B is a cross sectional view depicting the state of the flexible electronic system of FIG. 8A after a portion of the non-conductive foil has been peel off.

FIG. 8A and FIG. 8B illustrate another described embodiment of a flexible electronic system 800 according to the disclosure. The flexible electronic system 800 is similar in construction to the system 700 of FIGS. 7A and 7B. In contrast to the system 700 in FIG. 1, the portions 834, 836, 840 are fabricated in a single structure and an optional slit 840 is formed between the first and third portions 834, 840. To remove the foil 822, simply bend the system 800 along the slit 840 to break or separate the portions 734, 740 apart. Once the portions 734, 740 are separated, hold the end 832 of the third portion 840 using fingers and slightly bend the end 832 outwardly or away from the system 800, as depicted in FIG. 8B. Continue to bend the third portion 840 until the second portion 836 is detached from the contact pads 812, 814 such that the contact pads 812, 814 are in contact with each other to activate the battery 818. Continue to bend and peel the rest of the third portion 840 until a portion of the adhesive surface 826 covered by the third portion 840 is exposed. Now, hold the end 830 of the first portion 826 with fingers to peel the first portion 834 off the adhesive surface 826 until the remaining portion of the adhesive surface 826 initially covered by the first portion 834 is now exposed. Finally, the system 800 is now ready to be applied onto the site.

The systems 100, 200, 300, 400, 500, 600, 700, and 800 can be recycled or reused by attaching the respective foil back to the systems and cover the adhesive surface. Although only systems 700 and 800 illustrated a spring elements 750, 850 coupled to one of the contacts 714, 814, it should be understood that such spring element can be used and attached to the contact pad in other systems 100, 200, 300, 400, 500, and 700 so that the contact pads come in contact together after removal of the foil.

The embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling with the spirit and scope of this disclosure.

While the disclosure has been described with reference to various embodiments, it will be understood that these embodiments are illustrative and that the scope of the disclosure is not limited to them. Many variations, modifications, additions, and improvements are possible. More generally, embodiments in accordance with the patent have been described in the context or particular embodiments. Functionality may be separated or combined in blocks differently in various embodiments of the disclosure or described with different terminology. These and other variations, modifications, additions, and improvements may fall within the scope of the disclosure as defined in the claims that follow.

The invention claimed is:

1. A flexible electronic system comprising:
a battery;
a flexible electronic substrate including a first contact pad and a second contact pad, the first and second contact pads opposed to each other, and one of the first and second contact pads electrically coupled to the battery;
a base support fixedly attached to the flexible electronic substrate, the base support including an adhesive surface opposed to the flexible electronic substrate; and
a foil including a first portion removably coupled to at least a portion of the adhesive surface, and a second portion removably disposed between the first and second contact pads;
wherein removal of the second portion from between the first and second contact pads causes the battery to activate.

2. The flexible electronic system of claim 1, wherein:
the first portion of the foil is removably attached to a first portion of the adhesive surface;
the foil further includes a third portion removably attached to a second portion of the adhesive surface; and
an end of the third portion is connected to an end of the second portion so as to form a common end for the second and third portions.

3. The flexible electronic system of claim 2, wherein the first portion includes an end opposed to the end connected to the end of the third portion.

4. The flexible electronic system of claim 2, wherein the foil further includes a slit between the first portion and the third portion.

5. The flexible electronic system of claim 1, further comprising a protective cover disposed on the flexible electronic substrate.

6. The flexible electronic system of claim 1, further comprising a component electrically connected to one of the first and second contact pads.

7. The flexible electronic system of claim 6, wherein the component is selected from a group consisting of a sensor, a processor, a computer readable media, a communication interface, an ASIC, a capacitor, a transistor, and a resistor.

8. The flexible electronic system of claim 7, wherein the component and the battery are integrated into the flexible electronic substrate.

9. The flexible electronic system of claim 8, wherein the flexible electronic substrate is formed from dielectric material.

10. The flexible electronic system of claim 9, wherein the dielectric material is selected from a group consisting of fiberglass-filled epoxy and polyimide, FR-2 (phenolic cotton paper), FR-3 (cotton payer and epoxy), FR-4 (woven glass and epoxy), FR-5 (woven glass and epoxy), FR-6 (matte glass and polyester), G-10 (woven glass and epoxy), CEM-1 (cotton payer and epoxy), CEM-2 (woven paper and epoxy), CEM-3 (woven glass and epoxy), CEM-4 (woven glass and epoxy), CEM-5 (woven glass and polyester), polystyrene, polyimide, polytetrafluoroethylene (PTFE), plastic, ceramics, and polymer coated with Parylene.

11. The flexible electronic system of claim 10, wherein:
the flexible electronic substrate further includes a first layer and a second layer;
the component is integrated into the first layer; and
the battery is integrated into the second layer.

12. A flexible electronic system, comprising:
a battery;
a flexible electronic substrate including a first contact pad and a second contact pad, the first and second contact pads opposed to each other, and one of the first and second contact pads electrically coupled to the battery;
a base support fixedly attached to the flexible electronic substrate, the base support including an adhesive surface opposed to the flexible electronic substrate; and
a foil including a first portion removably coupled to at least a portion of the adhesive surface, and a second portion removably disposed between the first and second contact pads,
wherein removal of the second portion from between the first and second contact pads causes the battery to activate, and
wherein the foil further includes a grip portion located between the first portion and the second portion.

13. The flexible electronic system of claim 12, wherein the grip portion is wrapped around a portion of the system.

14. The flexible electronic system of claim 12, wherein the grip portion is spaced apart from the base support, so as to define a gap.

15. The flexible electronic system of claim 12, wherein the grip portion has a slit that is configured to break in order to separate the first portion from the second portion.

16. A flexible electronic system comprising:
a battery;
a flexible electronic substrate including a first contact pad and a second contact pad that are opposed to each other, one of the first and second contact pads electrically coupled to the battery; and
a foil including a first portion and a second portion removably disposed between the first and second contact pads;
wherein removal of the second portion from between the first and second contact pads causes the battery to activate, and
wherein the foil further includes a grip portion located between the first portion and the second portion.

17. The flexible electronic system of claim 16, wherein the flexible electronic substrate is formed from dielectric material.

18. The flexible electronic system of claim 17, wherein the dielectric material is selected from a group consisting of fiberglass-filled epoxy and polyimide, FR-2 (phenolic cotton paper), FR-3 (cotton payer and epoxy), FR-4 (woven glass and epoxy), FR-5 (woven glass and epoxy), FR-6 (matte glass and polyester), G-10 (woven glass and epoxy), CEM-1 (cotton payer and epoxy), CEM-2 (woven paper and epoxy), CEM-3 (woven glass and epoxy), CEM-4 (woven glass and epoxy), CEM-5 (woven glass and polyester), polystyrene, polyimide, polytetrafluoroethylene (PTFE), plastic, ceramics, and polymer coated with Parylene.

19. The flexible electronic system of claim 18, wherein the flexible electronic substrate further includes a first layer and a second layer.

20. The flexible electronic system of claim 19, further comprising a component electrically connected to one of the first and second contact pads;
wherein the component is integrated into the first layer, and the battery is integrated into the second layer.

* * * * *

UNITED STATES PATENT AND TRADEMARK OFFICE
CERTIFICATE OF CORRECTION

PATENT NO. : 10,537,022 B2
APPLICATION NO. : 16/062914
DATED : January 14, 2020
INVENTOR(S) : Christian Peters et al.

Page 1 of 1

It is certified that error appears in the above-identified patent and that said Letters Patent is hereby corrected as shown below:

In the Specification

At Column 1, Line 58: "cotton payer" should read --cotton paper--.

At Column 1, Line 61: "cotton payer" should read --cotton paper--.

At Column 2, Lines 10-11: "cotton payer" should read --cotton paper--.

At Column 2, Line 13: "cotton payer" should read --cotton paper--.

At Column 3, Line 48: "cotton payer" should read --cotton paper--.

At Column 3, Line 51: "cotton payer" should read --cotton paper--.

In the Claims

In Claim 10, at Column 8, Line 60: "cotton payer" should read --cotton paper--.

In Claim 10, at Column 8, Line 63: "cotton payer" should read --cotton paper--.

In Claim 18, at Column 10, Line 18: "cotton payer" should read --cotton paper--.

In Claim 18, at Column 10, Line 21: "cotton payer" should read --cotton paper--.

Signed and Sealed this
Seventh Day of April, 2020

Andrei Iancu
*Director of the United States Patent and Trademark Office*